United States Patent [19]

Tandon et al.

[11] Patent Number: 4,695,716
[45] Date of Patent: Sep. 22, 1987

[54] IMAGE SENSOR ARRAY FOR ASSEMBLY WITH LIKE ARRAYS TO FORM A LONGER ARRAY

[75] Inventors: Jagdish C. Tandon, Fairport; Mehdi N. Araghi, Webster, both of N.Y.

[73] Assignee: Xerox Corporation, Stamford, Conn.

[21] Appl. No.: 923,516

[22] Filed: Oct. 27, 1986

Related U.S. Application Data

[62] Division of Ser. No. 808,797, Dec. 13, 1985, Pat. No. 4,668,333.

[51] Int. Cl.$^4$ ............................................. H01V 40/14
[52] U.S. Cl. ............................... 250/211 R; 250/578; 357/30
[58] Field of Search ................ 250/211 R, 211 J, 578; 357/30 D, 30 H, 30 K, 24 LR; 358/212, 213, 293

[56] References Cited

U.S. PATENT DOCUMENTS 4,617,160 10/1986 Belanger et al. .................... 250/578

Primary Examiner—David C. Nelms
Attorney, Agent, or Firm—Frederick E. McMullen

[57] ABSTRACT

Apparatus and method of fabricating a sensor array from a (110) silicon substrate having a row of photosites to provides a sensor array chip with uniformly smooth and angled ends designed to permit the chip to be lock butted end to end with other like chips to form a full length scanning array in which the substrate is etched for separation along the (111) planes at the desired boundaries of the chip, the etched boundaries delimiting the chip ends running between selected pairs of photosites to provide whole photosites right up to the ends of the chip so as to avoid any cap or interruption between the photosites at the junctions with other chips.

In a second embodiment, the chip ends are formed with complementary irregular shapes to enhance locating and butting of the chips with one another, and in a third embodiment, grooves are etched between each of the photosites in the row to assure photosite uniformity and prevent cross talk between photosites.

1 Claim, 6 Drawing Figures

IMAGE SENSOR ARRAY FOR ASSEMBLY WITH LIKE ARRAYS TO FORM A LONGER ARRAY

This is a division of application Ser. No. 808,797, filed Dec. 13, 1985, now U.S. Pat. No. 4,668,333.

The invention relates to image sensor arrays and method of fabrication, and more particularly, to an image sensor array chip fabricated to permit the array to be assembled with other like chips to form a longer array without distortion or loss of image at the chip junctions.

Image sensor arrays for scanning document images, such as Charge Coupled Devices (CCD's), typically have a row or linear array of photosites together with suitable supporting circuitry integrated onto a substrate. Usually, an array of this type scans an image line by line across the document width while the document is moved in synchronism therewith in a direction paralleling the document length.

The image resolution of an array of this type is proportional to the ratio of the length of scan and the number of array photosites. Because of the difficulty in economically designing and fabricating arrays with a large number of photosites on one chip, image resolution for the typical commercial array available today is relatively low. And while resolution may be improved electronically by interpolating extra image signals or pixels, or by using several sensor arrays and electrically interlacing the arrays with one another so as to switch in succession from one array to the next as scanning across the line progresses, electronic manipulations of this type are costly. Further, single or multiple array combinations of the type described usually require a more complex and expensive optical system to assure that the array or arrays accurately scan the image line without loss or distortion.

A single array equal in size to the width of the document to be scanned, yet with a very large packing of photosites to assure the high resolution is needed but not available currently in the art. One concept that has been suggested is to form a single long or full width array by butting several small chips together. Since photosites can be closely packed on smaller chips without substantial and costly reduction in yield rates, a full width array having the large number of photosites needed to achieve high resolution can be achieved in this fashion. At the same time, optical requirements are greatly simplified. However, the inability to make the chips with ends that are smooth and straight enough to permit the chips to be butted together as well as the inability to separate a failed chip from the other chips for replacement or repair without damage to the photosites of the neighboring chips has heretofore effectively precluded this approach.

The present invention seeks to address and rectify the above by providing a sensor array chip capable of being physically abutted with other like chips accurately and without loss of image quality to form a longer composite array, the chip being fabricated in accordance with the following steps: forming at least one linear row of photosites on a (110) silicon substrate with the boundaries between photosites parallel to the (111) plane of the substrate whereby the photosite boundaries are at an acute angle to the longitudinal axis of the photosite row; orientation dependent etching the substrate along the (111) plane at predetermined spaced points along the photosite row to delimit the chip ends, the etching being along a line coincident with the boundary between photosites whereby the chip ends are at an acute angle to the longitudinal axis of the photosite row and the photosites adjoining the chip ends are unimpaired; and separating the chip from the substrate along the boundaries to provide a chip having a generally parallelogram shape with the chip ends extending at an acute angle to the longitudinal axis of the photosite row to facilitate butting and aligning of the chip in end to end relation with other like chips to form a longer composite scanning array.

IN THE DRAWINGS

Figure 1:
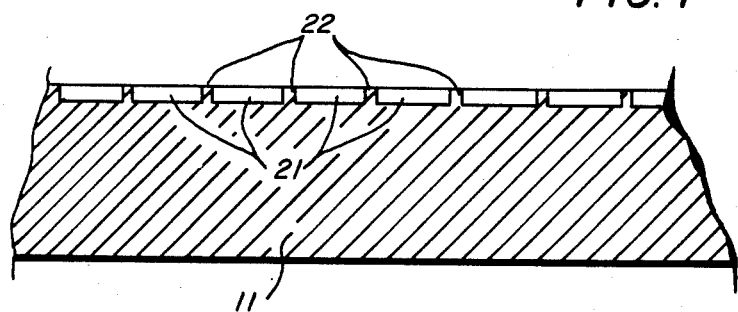
FIG. 1 is an enlarged front view in cross section of an image sensor array.

In FIG. 1 of the drawings, there is shown an image sensor array or chip having a base or substrate 11 of silicon with a row of photosites 21 along one surface thereof. Base 11 for example may comprise p-type silicon while photosites 21 may comprise n-type photodiodes. A separation area 22 is provided between the photosites 21 to isolate the photosites from one another to prevent crosstalk.

Figure 2:
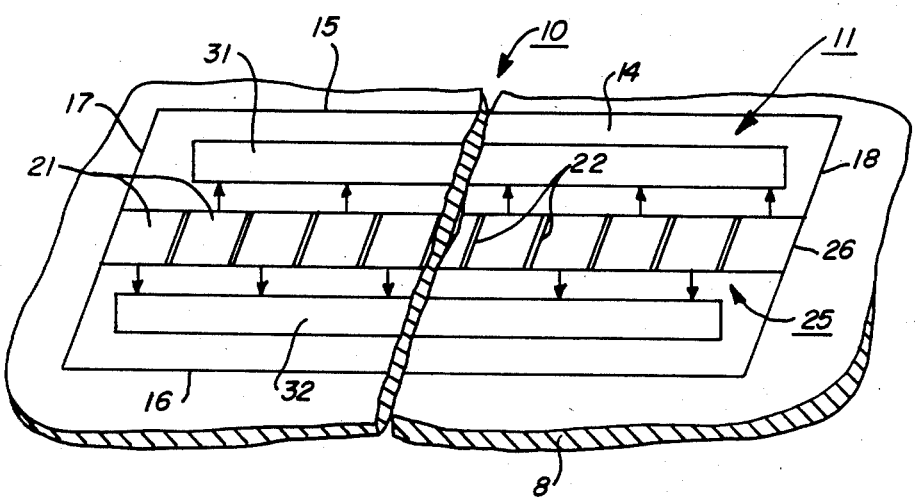
FIG. 2 is an isometric view of an image sensor array fabricated on (110) silicon in accordance with the invention to provide an image sensor chip having angled and uniformly smooth chip ends with unimpaired photosites extending up to the chip ends.
Figure 3:
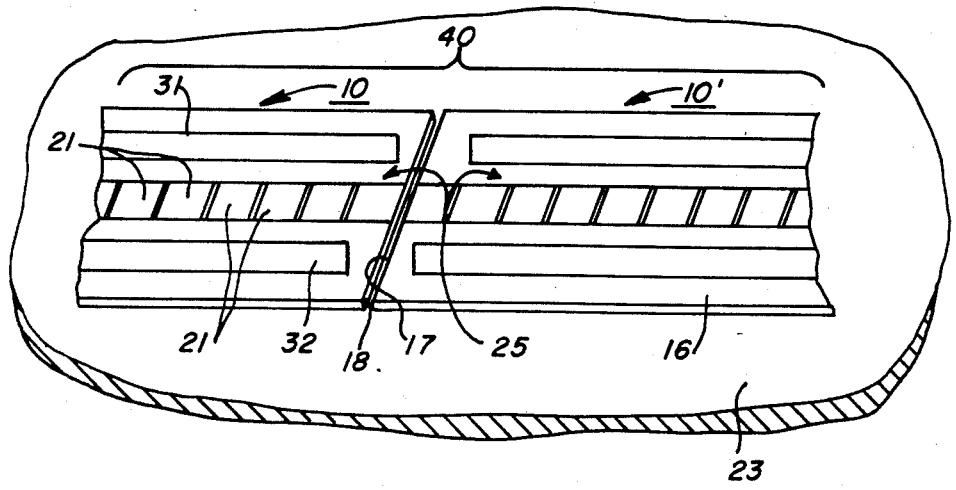
FIG. 3 is an isometric view illustrating image sensor chips of the type shown in FIG. 1 butted together end to end to form a longer continuous array.

Referring now to FIGS. 2 and 3 of the drawings, the image sensor array chip of the present invention, designated generally by the numeral 10, has a base 11 of (110) type silicon. As will be understood by those skilled in the art, (110) silicon has four (111) planes that intersect the (110) surface 14 of base 11 at 90°. Chip 10 is fabricated from a larger (110) silicon substrate or wafer 8 on which a plurality of chips 10 are formed as will be understood. Chips 10 are fabricated with one or more rows 25 of photosites 21 and may have other supporting circuits and components integrated thereon. Orientation dependent etching is used to precisely delineate the top and bottom edges 15, 16 and the array ends 17, 18 of chip 10 during fabrication. Later, the chips are separated from the substrate 8 and each other along the etched lines. However, since the (111) planes are not normal to each other but instead intersect at an acute angle of 75.53°, ends 17, 18 of chip 10 are not perpendicular to the top and bottom edges 15, 16 of chip 10 but instead are at an acute angle of 75.53° with respect thereto. As a result, chip 10, following orientation etching and separation from the wafer, is in the shape of a parallelogram.

The row 25 of photosites 21, which may for example be anisotropically etched, have boundaries paralleling the top and bottom edges 15, 16 and the ends 17, 18 of chips 10 so that photosites 21 are similarly in the shape of a parallelogram. In order not to impair or damage the photosites adjoining the chip ends 17, 18, ends 17, 18 are etched along a line 26 in the separation area 22 between adjoining photosites at the point where separation is to take place. While a single row 25 of photosites 21 are shown and described, plural rows of photosites may instead be envisioned. And while photosites 21 are preferably formed prior to the etching of the chip 10, the photosites may be formed after chip 10 has been separated from the (110) silicon wafer.

Other supporting circuits and components of the sensor array such as shift registers 31, 32, are preferably made integral with chip 10. Components such as shift registers 31, 32 may have a conventional rectangular shape as shown or alternately may be in the form of a parallelogram similar to that of chip 10 and photosites 21.

Chips 10 with photosites 21 of row 25 extending to the opposite sides 17, 18 of the chip base 11, are intended to be butted together to form a composite full width array 40. Advantageously, the number of chips 10 joined together would be sufficient to form a longer composite array 40 having an overall operating scan length equal to or slightly greater than the width of the longest document to be scanned and in that circumstance, array 40 would be termed a full width or contact type array. As will be understood however, the overall length of the composite array 40 may be greater or less that the width of the largest document in which case suitable optical means (not shown) would be employed to correlate the array operating scan length with that of the document.

Referring particularly to FIG. 3, during assembly of chips 10 together to form composite array 40, the chips are placed on a substrate 23 with the photosite rows 25 of each chip aligned with the other to avoid any image offset or loss along the scan line at the juncture of the chips with one another. Following alignment, the chips are butted together with end 17 of the first chip in mating engagement with the end 18 of the second chip, and the end 17 of the second chip in mating engagement with the end 18 of the third chip, and so on and so forth. A suitable adhesive (not shown) may be used to retain the chips in assembled relation with one another on substrate 23.

Figure 4A:
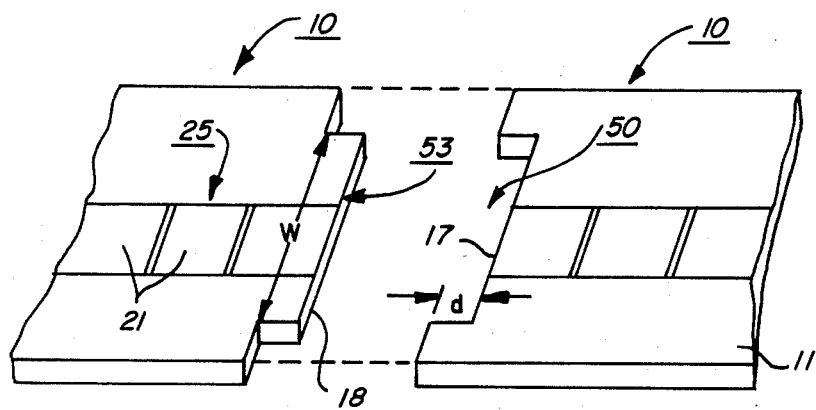
FIGS. 4a and 4b are isometric views illustrating different interlocking configurations for the chip ends to facilitate butting of the chip ends together.
Figure 4B:
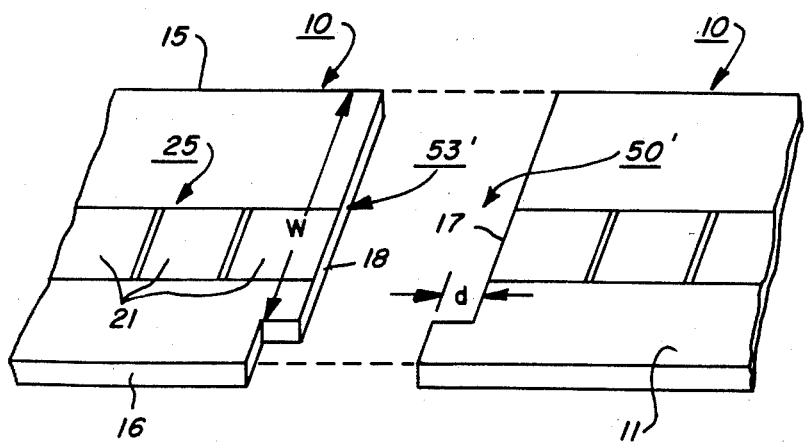

Referring to FIGS. 4a and 4b, where like numbers refer to like parts, to facilitate locating and butting of the chip 10 with other like chips to form a longer composite array 40, the chip ends 17, 18 may be formed with complementary interlocking geometrical shapes. In FIG. 4a, end 17 of base 11 of chip 10 is etched to provide a central recess or cutout 50 while the opposite end 18 has a complementary projection 53. Cutout 50 and projection 53 each have a width w and depth d that are substantially equal to one another to assure a tight interlocking fit between the end 17 or 18 of one chip with the complementary end 18 or 17 of a second chip. Matching cutout 50 and projection 53 have a width w sufficient to span across the width of the photosites 21 to prevent any intrusion into or impairment of the photosites adjoining the chip ends 17, 18.

In the arrangement shown in FIG. 4b, cutout 50' extends along chip end 17 to one edge 15 of the base 11 with the complementary projection 53' at the other end 18 similarly extending to edge 15 of base 11. The width w and depth d of cutout 50' and projection 53' are substantially equal to one another to assure a tight fit, with the width w of both cutout 50' and projection 53' being of sufficient dimension to span across the width of photosites 21.

Figure 5:
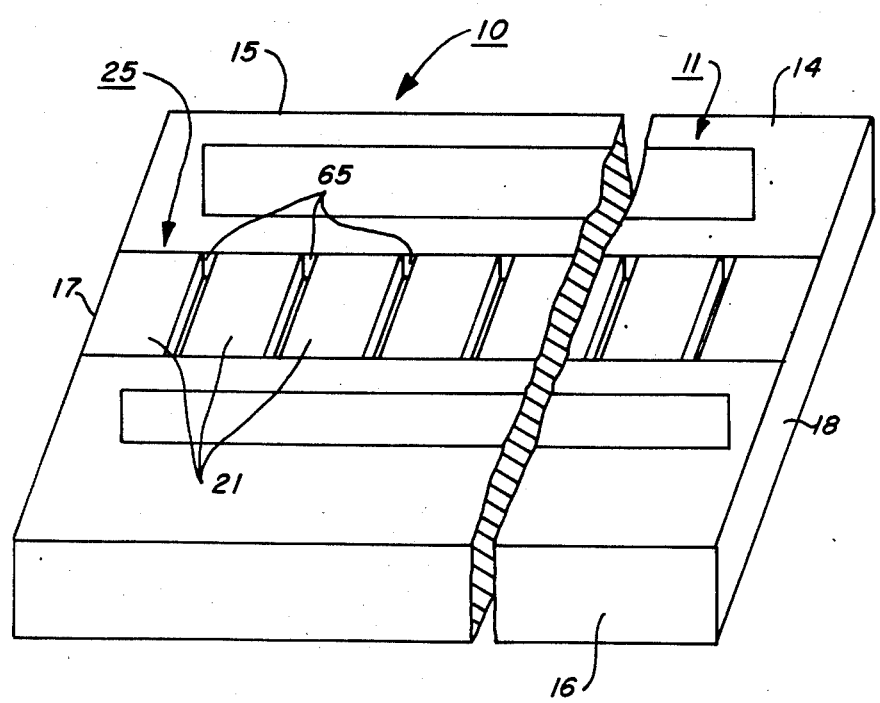
FIG. 5 is an isometric view of the array shown in FIG. 1 in which isolation grooves are formed between each photosite in the photosite row assure substantially equal sized photosites.

In the embodiment shown in FIG. 5, where like numerals refer to like parts, generally U-shaped grooves 65 are etched along the boundary lines between each photosite 21 of the photosite row 25. Grooves 65 serve to help isolate photosites 21 from one another thereby eliminating or reducing crosstalk between photosites, improving Mean Transfer Function (MTF), and assuring that all the photosites that comprise photosite row 25 are substantially equal in size.

To facilitate handling and assembly of chips 10 with one another, alignment grooves of the type shown in copending application Ser. No. 462,593, filed Jan. 31, 1983, in the name of James C. Stoffel, and entitled "Method And Apparatus For Fabricating Full Width Scanning Arrays", may be formed in the surface 14 of base 11 of sensor array 10. Such grooves, however, as will be understood by those skilled in the art, would in this application be U-shaped in configuration.

While the invention has been described with reference to the structure disclosed, it is not confined to the details set forth, but is intended to cover such modifications or changes as may come within the scope of the following claims.

We claim:

1. A sensor array adapted for assembly with other like arrays to provide a longer array, comprising;
   (a) a (110) silicon chip;
   (b) at least one row of photosites on said chip, the boundaries of said photosites being parallel to the (111) planes of said chip whereby said photosites are generally in the shape of a parallelogram;
   (c) the opposing ends of said chip being uniformly smooth and parallel to said chip (111) planes whereby the ends of said chip extend at an acute angle to the axis of said row of photosites so that said chip has a generally parallelogram shape complementary to said photosites;
   (d) each end of said chip being formed along a line passing along the boundary between adjoining photosites so that the photosites at the border of each end of said chip are unimpaired and the same size as the other photosites in said row of photosites whereby said chip may be assembled with other like chips by bringing said chip ends into abutting engagement with the ends of adjoining chips with the photosite row of said chip being aligned with the photosite rows of said adjoining chips.

* * * * *